(12) United States Patent
Gradinger et al.

(10) Patent No.: US 8,714,302 B2
(45) Date of Patent: May 6, 2014

(54) COOLING APPARATUS FOR COOLING A POWER ELECTRONIC DEVICE

(75) Inventors: Thomas Gradinger, Aarau Rohr (CH); Francesco Agostini, Zofingen (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 13/543,175

(22) Filed: Jul. 6, 2012

(65) Prior Publication Data

US 2013/0008633 A1 Jan. 10, 2013

(30) Foreign Application Priority Data

Jul. 7, 2011 (EP) .................................... 11173012

(51) Int. Cl.
*F01N 13/00* (2010.01)
*E04F 17/04* (2006.01)
*F28D 15/00* (2006.01)
*H05K 7/20* (2006.01)
*F24H 3/02* (2006.01)
*F24H 3/04* (2006.01)

(52) U.S. Cl.
USPC ...................... 181/225; 165/80.3; 165/104.33; 165/121; 165/122; 174/16.3; 181/224; 257/E23.088; 257/E23.099; 361/679.48; 361/679.49; 361/695; 361/700

(58) Field of Classification Search
USPC ........................... 181/225; 165/80.3; 361/695
See application file for complete search history.

(56) References Cited

U.S. PATENT DOCUMENTS 5,587,880 A * 12/1996 Phillips et al. ........... 361/679.47
6,073,683 A 6/2000 Osakabe et al.
6,226,182 B1 * 5/2001 Maehara ....................... 361/695
6,530,419 B1 * 3/2003 Suzuki .......................... 165/80.3
6,724,624 B1 * 4/2004 Dodson ......................... 361/695
6,765,796 B2 * 7/2004 Hoffman et al. .............. 361/695
6,840,311 B2 * 1/2005 Ghosh et al. ............. 165/104.33
6,927,978 B2 * 8/2005 Arai et al. ..................... 361/695
7,661,461 B2 * 2/2010 Chen ............................ 165/80.3
7,861,767 B2 * 1/2011 Mukasa ....................... 165/80.3

(Continued)

FOREIGN PATENT DOCUMENTS

| EP | 1052884 A2 | 11/2000 |
| EP | 1860523 A2 | 11/2007 |
| WO | WO 2011-035943 A2 | 3/2011 |
| WO | WO 2011035943 A2 * | 3/2011 |

OTHER PUBLICATIONS

*European Search Report issued on Dec. 15, 2011, for European Application No. 11173012.3.

(Continued)

*Primary Examiner* — David Warren
*Assistant Examiner* — Christina Russell
(74) *Attorney, Agent, or Firm* — Buchanan Ingersoll & Rooney PC

(57) ABSTRACT

Exemplary embodiments are directed to a cooling apparatus for cooling a power electronic device, the apparatus including at least one panel that is adapted to be thermally connected to a heat source in order to receive heat from the heat source. The panel is also adapted to be thermally in contact with an air flow in order to transfer heat from the panel. The panel includes at least one hole between a first side of the panel and a second side of the panel. The hole is adapted to attenuate a vibrating air pressure generated by an acoustic noise source and carried by the air.

14 Claims, 7 Drawing Sheets

(56) References Cited

U.S. PATENT DOCUMENTS

| | | | |
|---|---|---|---|
| 7,948,755 B1* | 5/2011 | Guan | 361/695 |
| 8,144,465 B2* | 3/2012 | Liang et al. | 361/692 |
| 2002/0154481 A1* | 10/2002 | Wagner | 361/694 |
| 2002/0189789 A1* | 12/2002 | Lin | 165/80.3 |
| 2004/0011511 A1* | 1/2004 | Ghosh et al. | 165/104.21 |
| 2004/0099407 A1* | 5/2004 | Parish et al. | 165/104.14 |
| 2005/0161280 A1* | 7/2005 | Furuya | 181/225 |
| 2007/0284093 A1* | 12/2007 | Bhatti et al. | 165/104.33 |
| 2010/0302715 A1* | 12/2010 | Bortoli et al. | 361/676 |
| 2011/0030400 A1* | 2/2011 | Agostini et al. | 62/118 |
| 2013/0077245 A1* | 3/2013 | Gradinger et al. | 361/700 |

OTHER PUBLICATIONS

Office Action dated Aug. 20, 2013 in a corresponding European application, 6 pps.

* cited by examiner

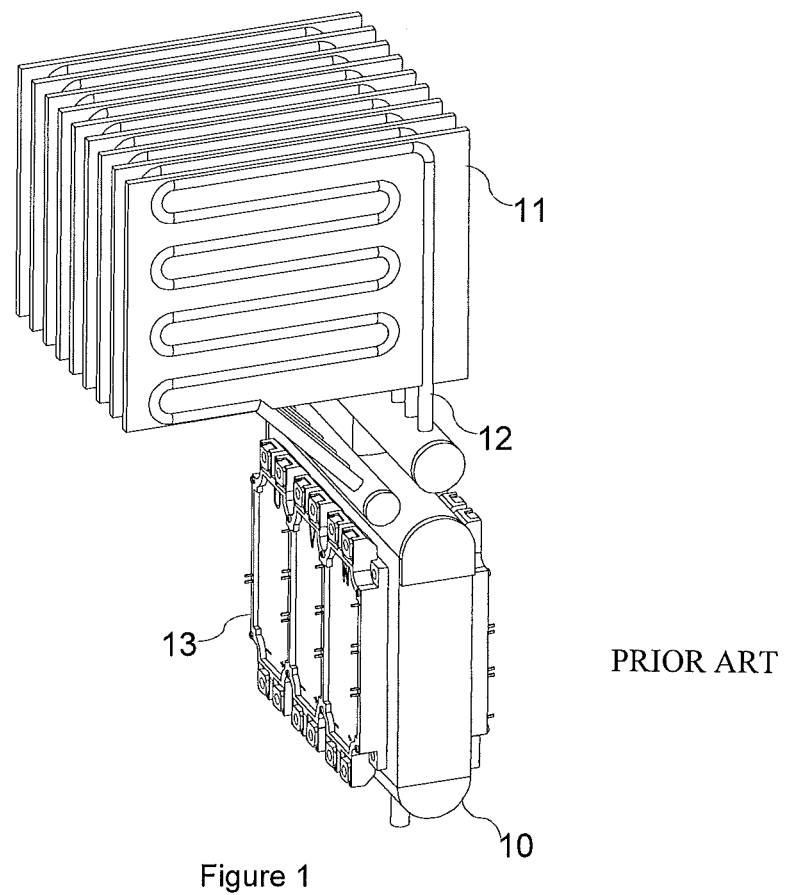
Figure 1        PRIOR ART
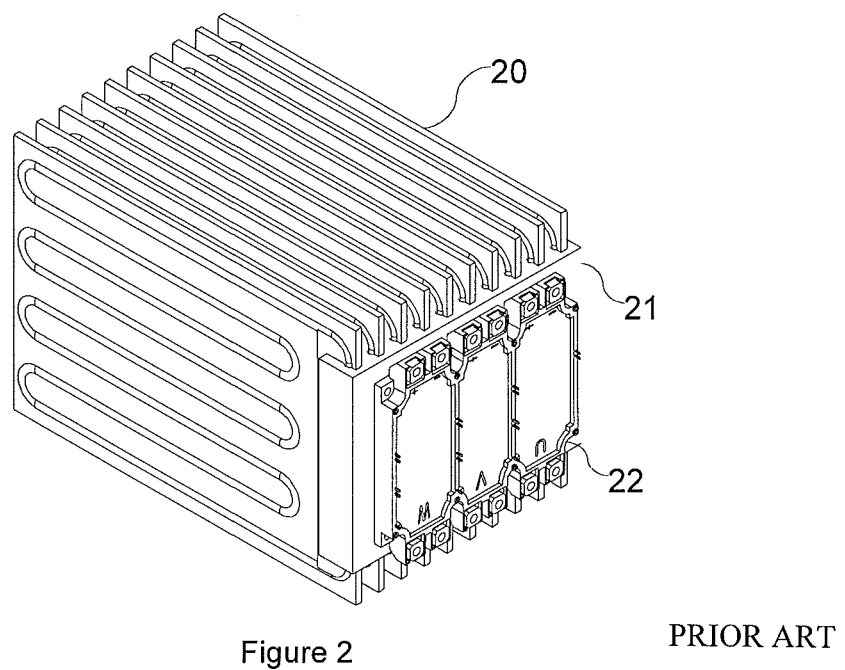
Figure 2        PRIOR ART

US 8,714,302 B2

COOLING APPARATUS FOR COOLING A POWER ELECTRONIC DEVICE

RELATED APPLICATION(S)

This application claims priority under 35 U.S.C. §119 to European Application No. 11173012.3 filed in Europe on Jul. 7, 2011. The content of which is hereby incorporated by reference in its entirety.

FIELD

The present disclosure relates to a cooling apparatus, such as a cooling apparatus for cooling power electronic devices by means of two-phase cooling systems, and for reducing the acoustic noise of such cooling systems.

BACKGROUND INFORMATION

Known power semiconductors produce heat as a by-product. At the same time, in order for a power semiconductor to function, its temperature should be kept within a given range. As a result, power semiconductors should be cooled.

Power electronic devices may, for instance, be cooled by a two-phase cooling system. Such a two-phase cooling system may, for example, include a circulatory system where a coolant is transferred between an evaporator and a condenser.

The evaporator is thermally connected to a heat source, for example an IGBT module. In the evaporator, the coolant is evaporated. Evaporating the coolant ties down heat, and thereby cools the heat source. The evaporated coolant is then moved to the condenser by using the circulatory system. In the condenser, the coolant is condensed and the heat it contains is released. This heat can be transferred to a flow of air.

FIG. 1 illustrates a first two-phase cooling system in accordance with a prior art implementation. As shown in FIG. 1 an evaporator 10 is connected to a condenser made of a stack of panels 11 via coolant conduits 12. Power electronic devices, in this case IGBT modules 13, are mounted on the evaporator 10. FIG. 2 illustrates a second two-phase cooling system in accordance with a prior art implementation. As shown in FIG. 2, condenser panels 20 are embedded in a base plate 21, to which power electronic devices 22 are attached.

The flow of air may be gravitational or produced mechanically. An air flow generated by gravity has a limited air speed, which means a limited heat-transfer coefficient and, hence, a limited cooling performance. In order to achieve higher performance, a mechanically produced air flow may have to be used. A fan can be used to produce an air flow.

FIG. 3 shows a schematic diagram of an exemplary power drive system with an air ventilation system in accordance with a prior art implementation. The air ventilation system consists of an air duct 30 inside which a fan 31 is provided for generating the air flow, and a stack of condenser panels 32. The condenser panels 32 transfer heat from power electronic devices 33 mounted on an evaporator 34 to the air flow. A passive component 35, such as a choke, may also be placed in the air duct 30 to be cooled by the air flow.

In FIG. 3, the achievable cooling performance may be limited owing to acoustic noise restrictions. The fan 31 may constitute a dominant noise source, and the noise level may increase strongly along with an increasing air volume flow rate or speed, respectively. Noise generated by the fan 31 can propagate in the air of the duct 30, and through inlet and outlet, out of the duct into the environment, where the allowable noise level is limited.

The allowable noise level may limit the maximum air speed used, and a limited air speed, in turn, may limit a heat-transfer coefficient between the air flow and the panel, and hence limit the cooling performance.

To reduce the emission of air-borne noise into the environment in the power drive system of FIG. 3 (or, alternatively, to allow for an increase in fan and hence cooling power, while still respecting the noise limits), the air duct system 30 may be equipped with means for attenuating the noise. As the noise may propagate upstream and downstream from the fan 31, two additional components may be called for in the ventilation system. However, adding these components may increase the volume, weight, pressure drop and cost of the cooling arrangement.

SUMMARY

An exemplary cooling apparatus for cooling a power electronic device is disclosed, the apparatus comprising: at least one panel, the at least one panel being adapted to be thermally connected to a heat source in order to receive heat from the heat source and adapted to be in thermal contact with an air flow in order to transfer heat from the at least one panel, wherein the at least one panel comprises at least one hole between a first side of the panel and a second side of the panel, the hole being adapted to attenuate a vibrating air pressure generated by an acoustic noise source and carried by air by inducing a vibrating air flow through the hole on excitation by the vibrating air pressure.

An exemplary method for cooling a power electronic device is disclosed, the method comprising: thermally connecting a panel to a heat source in order to receive heat from the heat source, wherein the panel comprises at least one hole between a first side of the panel and a second side of the panel, wherein the hole attenuates a vibrating air pressure generated by an acoustic noise source and carried by air by inducing a vibrating air flow through the hole on excitation by the vibrating air pressure, and arranging the panel to be thermally in contact with an air flow in order to transfer heat from the panel.

BRIEF DESCRIPTION OF THE DRAWINGS

In the following the disclosure will be described in greater detail by means of preferred embodiments with reference to the accompanying drawings, in which FIG. 1 illustrates a first two-phase cooling system in accordance with a prior art implementation;

FIG. 2 illustrates a second two-phase cooling system in accordance with a prior art implementation;

DETAILED DESCRIPTION

The noise level limits can be respected without additional components by integrating two functions, heat transfer and sound attenuation, into a single apparatus. A sound attenuator may be formed from perforated panels constituting a condenser of a two-phase cooling system.

The sound attenuation can be effected by Helmholtz resonators formed by the holes in the panels and cavities. The perforated panels may also be arranged such that the noise induces a pressure difference between two sides of the panels. The pressure difference, in turn, causes a flow of air through the holes. The noise attenuation takes place by friction of the flow through the holes.

The sound attenuating property of the apparatus allows for the selection of fans of higher power (which emit more noise) to increase cooling performance, while still staying within the noise limits usually imposed on power electronic systems.

Figure 3:
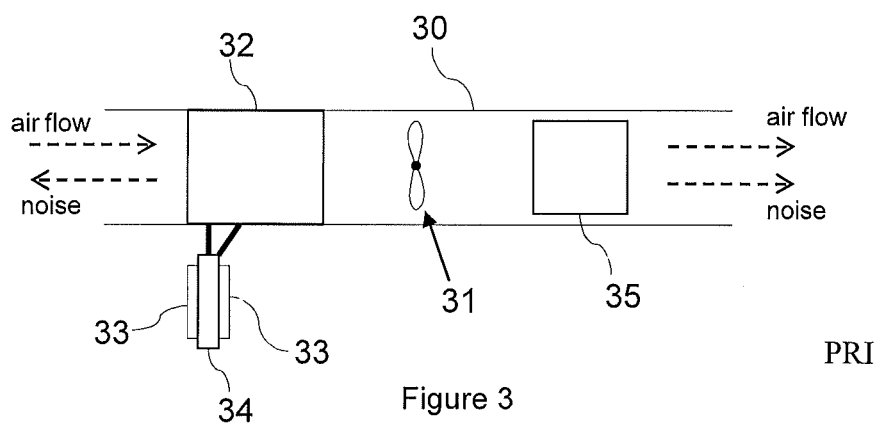
FIG. 3 illustrates a schematic diagram of an exemplary power drive system with an air ventilation system in accordance with a prior art implementation.
Figure 4:
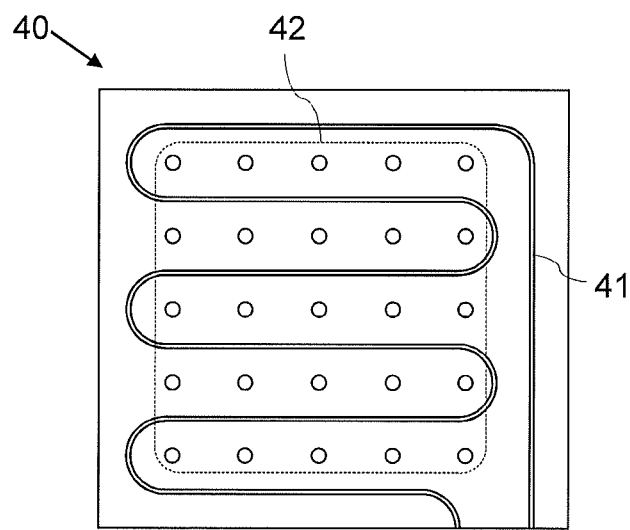
FIG. 4 illustrates an exemplary condenser panel with a sound attenuating property in accordance with an exemplary embodiment of the present disclosure.

FIG. 4 illustrates an exemplary condenser panel with a sound attenuating property in accordance with an exemplary embodiment of the present disclosure. The panel may, for instance, be used in a cooling apparatus for cooling a power electronic device. The apparatus combines functions of a condenser and a sound attenuator. It includes at least one panel 40. In some embodiments, a stack of panels 40 may be used. A panel 40 is adapted to be thermally connected to a heat source in order to receive heat from the heat source. The apparatus may, for instance, be used in a two-phase cooling system comprising of a circulatory system where a coolant is circulated between an evaporator and a condenser. As shown in FIG. 4, a coolant circulates through coolant channels 41 in the panel 40. The panel 40 is also adapted to be thermally in contact with an air flow in order to transfer the heat from the panel.

In order to achieve a sound attenuating property, the panel 40 includes at least one hole 42 between a first side of the panel and a second side of the panel. In FIG. 4, a matrix of holes 42 goes through the panel 40. The hole 42 is adapted to attenuate noise by inducing a vibrating air flow through the hole on excitation by the vibrating air pressure. The noise manifests itself in a form of a vibrating air pressure generated by an acoustic noise source and carried by the air.

Sound can be attenuated by the friction forces of a vibrating air flow through a hole, where the vibrating air flow is caused by the vibrating air pressure generated by the noise source. The vibrating air flow through the hole can be of two types: It can be either resonant or non-resonant.

To obtain a resonant vibrating air flow through the hole, exemplary embodiments of the present disclosure can include a Helmholtz resonator formed by the hole and a cavity next to the hole.

To obtain a non-resonant vibrating air flow, exemplary embodiments can be arranged such that no cavity is provided but the hole may be directly exposed to the cooling air flow on both sides.

The hole or holes in the panel may be provided with an element increasing a resistance of the vibrating air flow through the hole, thus increasing the acoustic noise attenuation. Absorptive material, such as rock wool or open-cell foam, may be used to increase friction. Sound energy may also be dissipated by a frictional flow in the resonator's neck.

An exemplary embodiment of the present disclosure can include cooling apparatus having at least one condenser panel with a sound attenuating property may be used in an arrangement that includes a fan for generating a cooling air flow. The arrangement has one or more of the cooling apparatuses. The panel of the apparatus may be adapted to attenuate acoustic noise generated by the fan. Integrating the heat transfer and sound attenuation into a single apparatus may, thus, eliminate a need for separate means for attenuating the noise generated by the fan.

Figure 5:
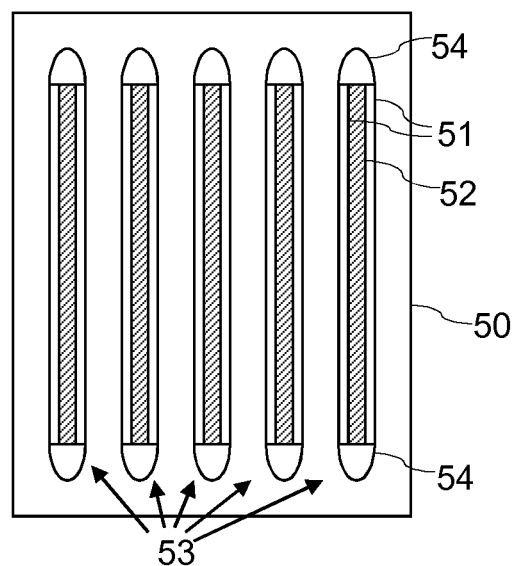
FIG. 5 illustrates a first exemplary cooling apparatus for cooling a power electronic device in accordance with an exemplary embodiment of the present disclosure.

FIG. 5 illustrates a first exemplary cooling apparatus for cooling a power electronic device in accordance with an exemplary embodiment of the present disclosure. FIG. 5, showing a section through a stack of panels, illustrates an exemplary cooling apparatus 50 for cooling a power electronic device wherein Helmholtz resonators are used to achieve sound attenuation. The apparatus 50 includes a plurality of panels 51 which are adapted to be thermally connected to a heat source in order to receive heat from the heat source. The panels 51 may be manufactured, for instance, by roll bonding.

The panels 51 are arranged into a stack of adjacent panels with gaps between the panels. The panels 51 form a condenser of a two-phase cooling system which may, for instance, include the condenser, an evaporator, and a circulatory system connecting the condenser and the evaporator. A coolant circulates in the circulatory system. The coolant is heated by a heat source. The heat source may, for instance, be an IGBT module or include a plurality of IGBT modules. However, the apparatus 50 is not limited to cooling IGBT modules, but it can be used to cool a large variety of devices. The air flow may be produced by a fan.

The panels 51 can be adapted to be thermally in contact with an air flow in order to transfer the heat from the condenser formed from of the panels. The coolant may be transferred to the condenser through the circulatory system. In the condenser, the heat stored in the coolant is dissipated into a flow of air. The panels 51 can include a matrix of holes between a first side of the panel and a second side of the panel. The matrix of holes can, for instance, be made by punching.

The first sides of the panels 51 are arranged to be in contact with the cooling air flow. The holes lead into chambers on the second sides of the panels. The holes and the chambers form Helmholtz resonators which may be used to attenuate sound.

Figure 6A:
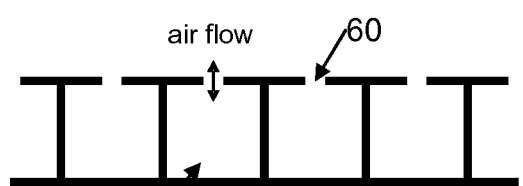
FIGS. 6a, 6b, and 6c illustrate examples of different Helmholtz resonator implementations in accordance with an exemplary embodiment of the present disclosure.
Figure 6B:
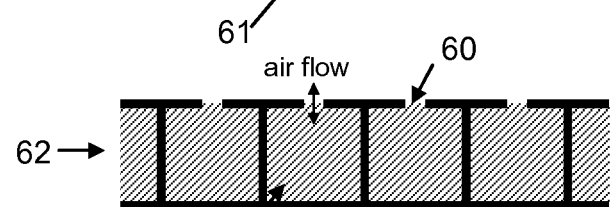
Figure 6C:
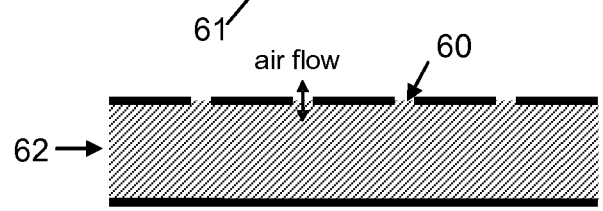

FIGS. 6a, 6b, and 6c illustrate examples of different Helmholtz resonator implementations in accordance with an exemplary embodiment of the present disclosure. A single, classical Helmholtz resonator includes of a neck 60 and an empty cavity 61, as illustrated in FIG. 6a. Using a mechanical analogy, the air in the cavity 61 constitutes a spring, the air in the neck 60 constitutes a mass of the resonator (together with some mass near the neck, which also participates in the vibration), and the air flow in the neck 60 causes the frictional damping forces.

In this type of Helmholtz resonator, the frictional damping forces are small, and the velocity amplitudes in the neck close to the resonance frequency are high. As a consequence, the resonator is highly efficient, but only in a frequency range close to resonance. At other frequencies, the dissipation of acoustic energy is small. Hence, such resonators may be useful in filtering out a desired frequency, such as the dominant frequency in tonal noise. For a broad-band noise, they are likely to be inefficient.

Figure 7A:
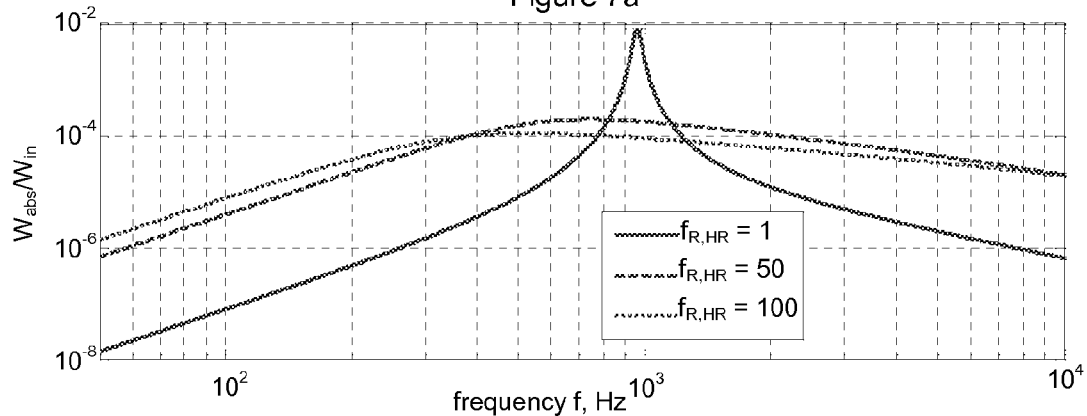
FIGS. 7a, 7b, and 7c illustrate a simulated efficiency of an exemplary Helmholtz resonator in accordance with an exemplary embodiment of the present disclosure.
Figure 7B:
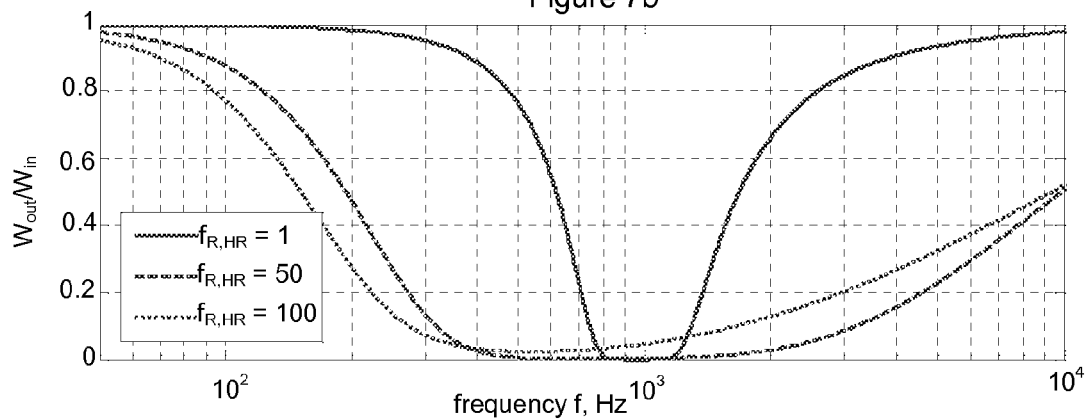
Figure 7C:
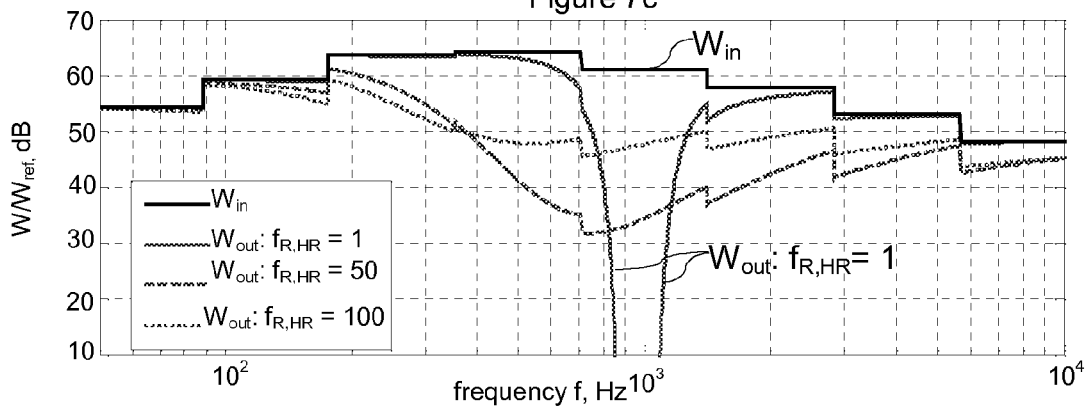

FIGS. 7a, 7b, and 7c illustrate a simulated efficiency of an exemplary Helmholtz resonator in accordance with an exemplary embodiment of the present disclosure. In these simulations the exemplary resonator had the following geometry: neck diameter 2 mm, neck length 1.2 mm, chamber depth 9.6 mm, a square chamber footprint having a side length of 20 mm.

The solid line in FIG. 7a shows a ratio of absorbed sound power ($W_{abs}$) to sound power transmitted in a channel ($W_{in}$), based on a Helmholtz flow in the neck. The Helmholtz resonator was designed for a resonance frequency of about 1 kHz, and it can be seen that around this frequency, the absorbed power peaks, whereas when moving to lower or higher frequencies it drops sharply.

FIG. 7b shows a ratio of outgoing power ($W_{out}$) to incoming power ($W_{in}$) for many Helmholtz resonators in a stack of panels. In this exemplary simulation the following dimensions for the panels were used: panel height 250 mm, panel length (in streamwise direction) 500 mm. A total air flow cross-sectional area inside the panel stacks was 0.152 m$^2$.

In an exemplary simulation it was assumed that the pitch of the resonators in every direction was 20 mm (=chamber footprint side length), the panel thickness (=chamber neck length) was 1.2 mm, the chamber depth was 9.6 mm, and that 90% of the available panel area could be covered with an array of resonators. This design resulted in a total of about 34000 Helmholtz resonators. These resonators were assumed to act on the sound power in series so that each resonator reduces the sound power by a constant ratio. Despite the large number of resonators, it can be seen in FIG. 7b that the sound power was strongly reduced only in a neighborhood of 1 kHz.

In FIG. 7c, the effect of the resonators on the sound power level of a radial fan generating broad-band noise is shown. In this exemplary simulation the sound power was reduced to almost zero in the vicinity of 1 kHz, and remained almost unchanged at low and high frequencies, such that the overall reduction in an A-weighted sound pressure level was small, in this case only 3 dB(A).

As the flow resistance was increased, the velocity amplitude and the dissipation were reduced at the resonance frequency, but the dissipation was increased at frequencies distant from the resonance frequency. This can be seen in the top plot of FIG. 9, for the cases of neck resistance increased by a factor $f_{R,HR}$=50 and 100.

Returning to FIGS. 6a, 6b, and 6c, an increase in the neck 60 resistance can, in principle, be achieved by filling the chambers 61 with an absorptive material, as shown in the middle of FIG. 6b. The absorptive material 62 is most effective in the region close to the neck 60, because the velocities are highest there. For the present case, $f_{R,HR}$=50 was optimal, and yielded the largest overall reduction in sound power and sound pressure. The decrease in the A-weighed sound pressure level was 13.2 dB(A) for $f_{R,HR}$=50 and 10.7 dB(A) for $f_{R,HR}$=100, respectively.

The computational model used to obtain these values was an analytical model implemented in MATLAB. In an exemplary embodiment the model was used for absolute predictions of noise levels, rather than for explaining the physical effects and showing the feasibility of the present concept.

To make the construction easier, the absorptive material 62 may be used to form walls of the chambers 61, as illustrated in FIG. 6c. The absorptive material 62 has an effect similar to that of the walls, in that it largely suppresses an air flow between adjacent chambers.

In FIG. 5, every other gap between adjacent panels 51 is filled with an absorptive material 52. Two panels 51 with the absorptive material 52 therebetween form a sound attenuating composite structure 53.

To reduce an aerodynamic resistance of the sound attenuating composite structures 53, and to protect the absorptive material 52, end caps 54 may be attached to the sound attenuating composite structure 53, as shown in FIG. 5. The absorptive material 52 can be any suitable material, for example rock wool, fiberglass or open-cell plastic foam. The panels 51 may, for instance, be roll bonded from aluminium. The end caps 54 can, for example, be made by injection moulding of plastic.

Roll-bonded panels are currently used in refrigerators. Thus, an infrastructure already exists for inexpensive mass production of these panels. This infrastructure may directly be used for the production of the roll-bonded panels disclosed above. Acoustic absorption materials are used in a large variety of applications, so an existing infrastructure for mass production can be used.

As the matrix of holes in the panels can be made by punching, the holes may be produced in a cost-effective manner for large numbers of pieces after an initial investment in tooling.

The holes may also have the effect of disturbing the air flow by increasing turbulence and, thus, increasing a heat-transfer coefficient between air and a panel.

A drawback of the concept presented in FIG. 5 is that, compared with the stacks of panels of FIG. 1 and FIG. 2, only one half of the panel surface is thermally active because the other half is covered by the absorption material. In some implementations, this cannot be avoided with the principle of Helmholtz resonators, since they can call for chambers (or, equivalently, absorptive material) on one side of the panel. Still, there are savings in volume, weight and number of components in the concept of FIG. 5, compared with sound attenuation which is not thermally active.

In order to double the thermally useful area per panel, two sides of the panel may be arranged to be in contact with the air flow. In an exemplary embodiment, Helmholtz resonators may not be implementable when both sides of the panel are in contact with the air flow. However, the panels may be arranged to be in contact with the air flow in such a manner that noise in the form of vibrating air pressure generates an air pressure difference between the two sides. This difference will induce an air flow through the hole, and the frictional forces associated with this flow will attenuate the sound (dissipate sound energy).

Figure 8A:
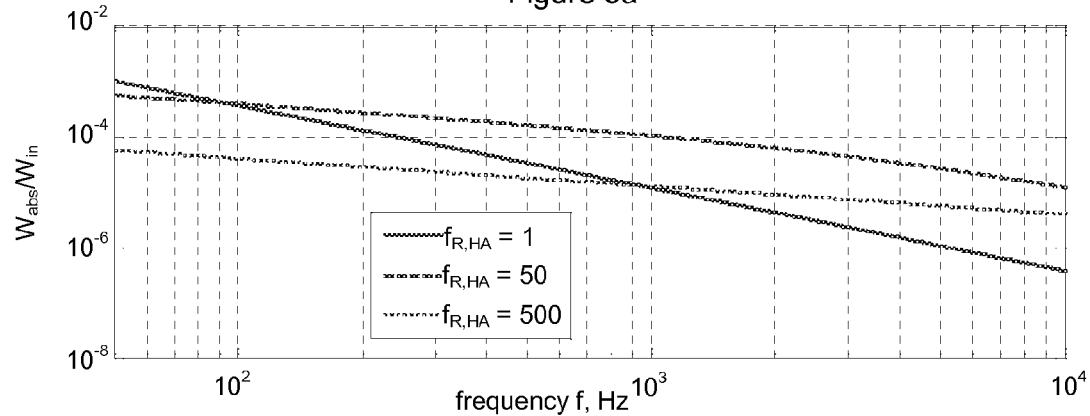
FIGS. 8a, 8b, and 8c illustrate a simulated example of efficiency of a hole arrangement in accordance with an exemplary embodiment of the present disclosure.
Figure 8B:
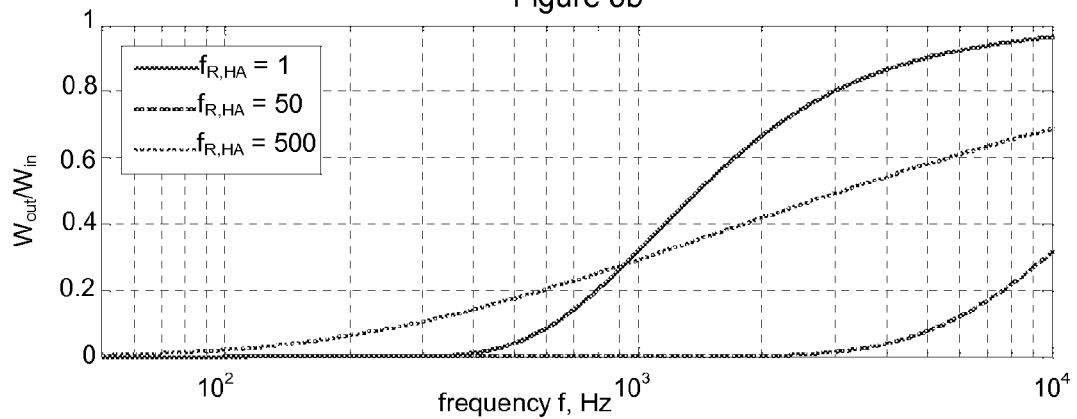
Figure 8C:
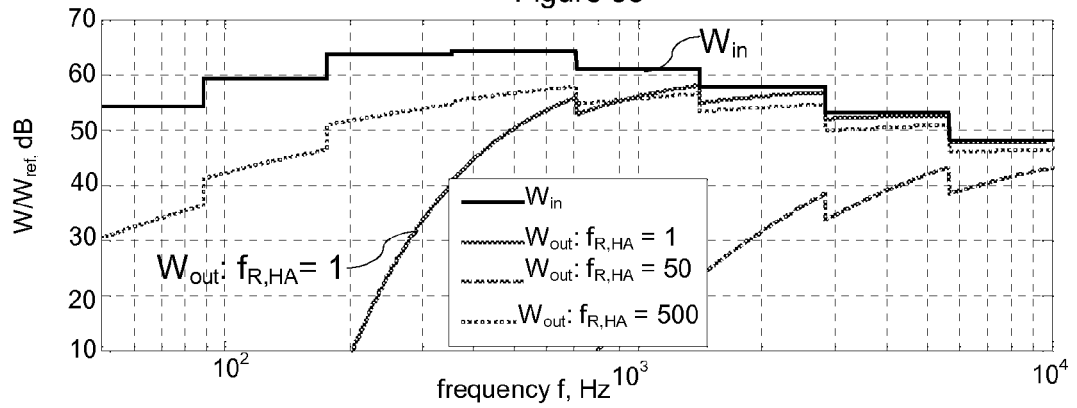

FIGS. 8a, 8b, and 8c illustrate a simulated example of efficiency of a hole arrangement in accordance with an exemplary embodiment of the present disclosure. As shown in FIGS. 8a, 8b, and 8c a pressure difference between the perforated panel sides is used for sound attenuation. For plain (e.g., empty) holes having a diameter of 2 mm, the frictional damping forces are quite small. Therefore, high velocity amplitudes may be called for to obtain significant dissipation of acoustic energy. Such high velocities only exist at very low frequencies, since the holes constitute a low-pass filter. For higher frequencies, inertia of the flow through the hole prevents high velocity amplitudes.

The results are shown by the solid lines in FIGS. 8a, 8b, and 8c, in a similar manner to FIGS. 7a, 7b, and 7c. Owing to the weak attenuation of the higher frequencies, the overall reduction of A-weighted sound power is 5 dB(A) only. The following dimensions were used for simulations in FIGS. 8a, 8b, and 8c: hole diameter 2 mm, hole length (=panel thickness) 1.2 mm, hole pitch (=distance between centres of adjacent holes) 20 mm.

The following parameters can be chosen for the stack of panels: panel height 250 mm, panel length (in streamwise direction) 500 mm. A total air flow cross-sectional area inside the panel stacks was 0.155 m$^2$, and number of holes in the panels was about 35000. These parameters are similar to the values of the example in the FIGS. 7a, 7b, and 7c. These holes are assumed to act on the sound power in series, such that each hole reduces the sound power by a constant ratio.

As the air flow resistance was increased up to a certain value in the simulation, the velocity amplitude was reduced. At the same time, the dissipation was increased at almost all frequencies except for at very low frequencies, illustrated by the dashed curve in FIGS. 8a, 8b, and 8c. Here, the factor $f_{R,HA}=50$ was applied to multiply the resistance of the Helmholtz flow through a plain hole.

A further increase in the resistance caused the dissipation to decay again, as shown by the dotted curve for $f_{R,HA}=500$ in FIGS. 8a, 8b, and 8c. The factor $f_{R,HA}=50$ seemed to be close to the optimum for the present case. The reduction in sound power was then 22.3 dB(A) according to the computational model implemented in MATLAB.

Figure 9A:
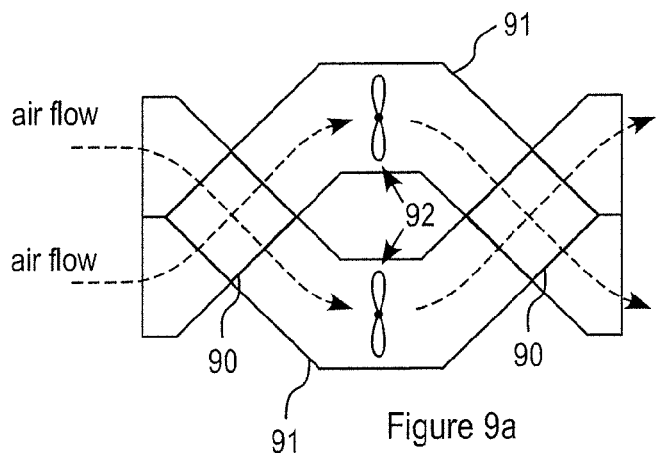
FIGS. 9a and 9b illustrate a second exemplary cooling apparatus for cooling a power electronic device in accordance with an exemplary embodiment of the present disclosure.
Figure 9B:
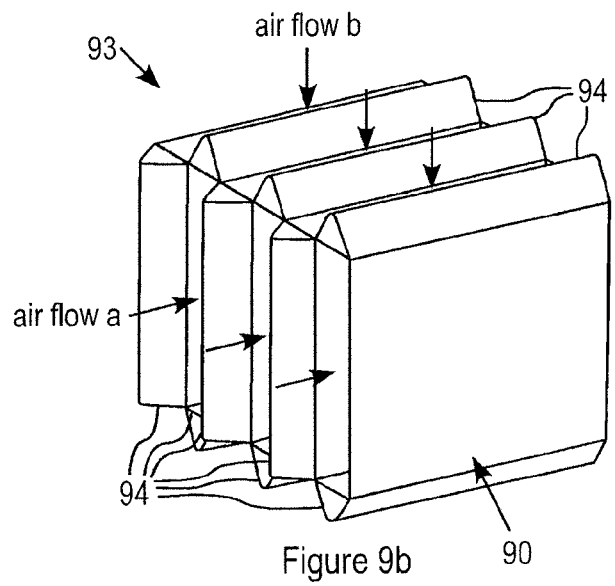

FIGS. 9a and 9b illustrate a second exemplary cooling apparatus for cooling a power electronic device in accordance with an exemplary embodiment of the present disclosure. In FIG. 9a, a stack of perforated roll-bonded panels 90 are used to separate two adjacent air ducts 91 that carry the noise from two fans 92. Each panel 90 is exposed to a vibrating air pressure of the first fan on one side, and to a vibrating air pressure of the second fan on the other side. The two fans 92 are uncorrelated noise sources, e.g., the phase between the pressures of the two fans 92 is random at the frequencies of interest. The noise attenuation occurs by friction of the flow through the holes in the panels 90.

FIG. 9b illustrates an exemplary panel stack 93 which may be used in the arrangement of FIG. 9a. In FIG. 9b, an air flow a generated by a first fan flows from left to right through the stack 93 of panels 90, and an air flow b generated by a second fan flows from top to bottom through the stack 93 of panels 90. Each side of the stack 93 of panels 90 is provided with splitters 94, drawn with an approximately triangular cross-section in FIG. 9b, that guide the flows to the individual channels and act as diffusers (recovering static pressure) for the flow exiting the channels.

Figure 10:
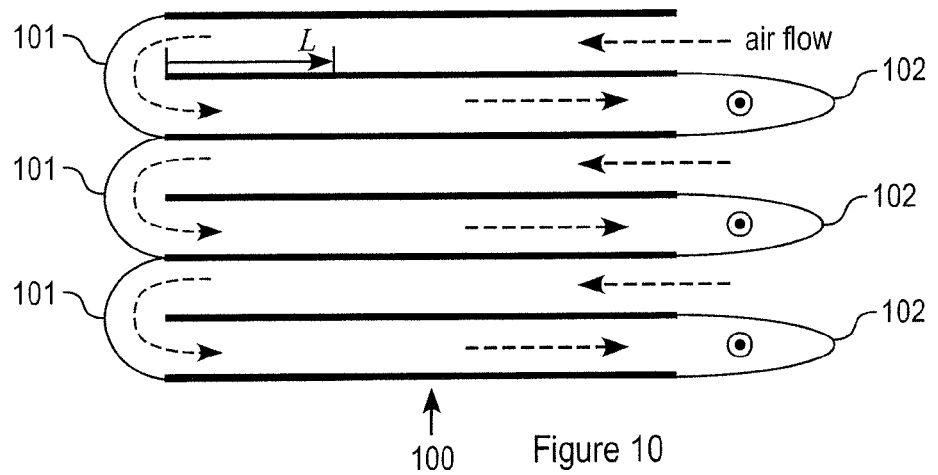
FIG. 10 illustrates an exemplary arrangement of perforated panels in accordance with an exemplary embodiment of the present disclosure.

FIG. 10 illustrates an exemplary arrangement of perforated panels in accordance with an exemplary embodiment of the present disclosure. As shown in FIG. 10, a difference in pressure may also be accomplished using one fan. The holes in the panels 100 are adapted to attenuate noise by inducing a vibrating air flow on excitation by the vibrating air pressure of the noise.

A phase difference in pressure is created by guiding the air first in one direction in one channel, and, after a 180° turn 101, in an opposite direction in another adjacent channel. The air flow is first in contact with one side of the panel, and, after making the turn, in contact with another side of the panel. After passing the adjacent channel, the air flow makes a 90° turn 102. In FIG. 10, the air flow exits towards the viewer.

The phase shift is zero at the 180° turn 101 and grows with a distance L shown in FIG. 10. A slight disadvantage of this arrangement is that an extra pressure drop is introduced by the 180° turn 101 and the 90° turn 102.

In an exemplary embodiment of the present disclosure the pressure difference can be at its maximum if 2 L=λ/2 where λ is a wave length. In this case the phase shift is 180°. For low frequencies, the distance L can be quite long: for example for 100 Hz, λ=3.4 m and L=0.85 m. Hence, in order to be effective at low frequencies, the arrangement of FIG. 10 specified a certain length of the panels 100.

Figure 11A:
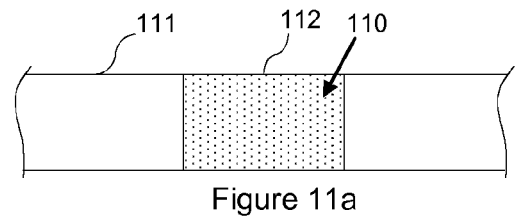
FIGS. 11a and 11b illustrate an exemplary implementation for adding a resistive element into or onto a hole in a panel in accordance with an exemplary embodiment of the present disclosure.
Figure 11B:
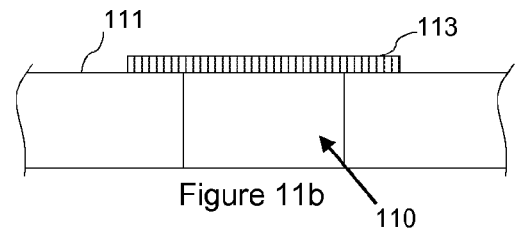

FIGS. 11a and 11b illustrate an exemplary implementation for adding a resistive element into or onto a hole in a panel in accordance with an exemplary embodiment of the present disclosure. The resistance of the holes can be increased by inserting a resistive element in each hole. As shown in FIGS. 11a and 11b a resistive element can be added to a hole 110 in a panel 111. In FIG. 11a, a plug 112 is made from a material with open pores. The plug can be glued to a wall of the hole 110, or it can be held in place by an interference fit; i.e. the plug's diameter is slightly oversized, and the plug 112, which is elastic, is slightly compressed during insertion into the hole 110. FIG. 12b illustrates an alternative where a mesh 113 is attached to the panel 111 to cover the hole 110, for instance, by gluing or brazing.

In an exemplary embodiment of the present disclosure, no plug or mesh, e.g., no additional part at all, but to increase the frictional forces by increasing a ratio of the hole perimeter to the hole area. A simple way to accomplish this is to reduce the diameter of the circular holes, while increasing the number of holes, e.g., decreasing the pitch of the holes. However, it may be impossible to punch very small, circular holes since the punching tool cannot be arbitrarily small. An alternative is to punch (or cut) thin slits instead of circular holes.

Figure 12A:
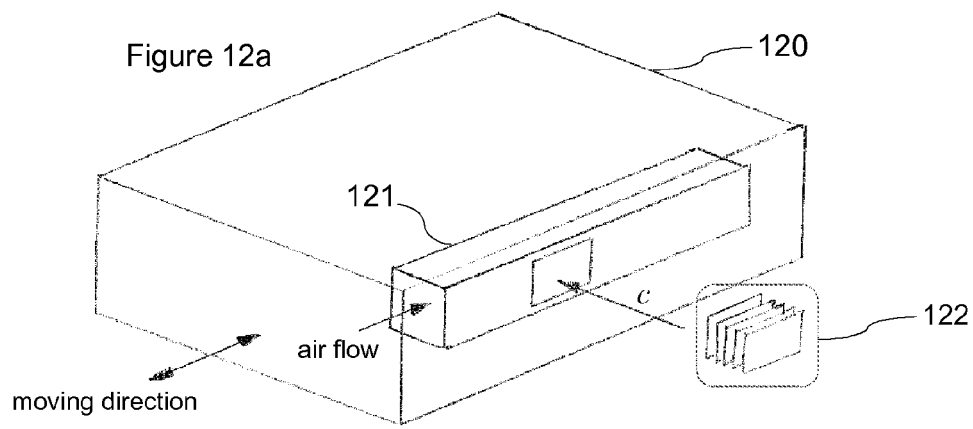
FIGS. 12a, 12b, and 12c illustrate an exemplary cooling arrangement for a traction converter of a rapid transit system in accordance with an exemplary embodiment of the present disclosure.
Figure 12B:
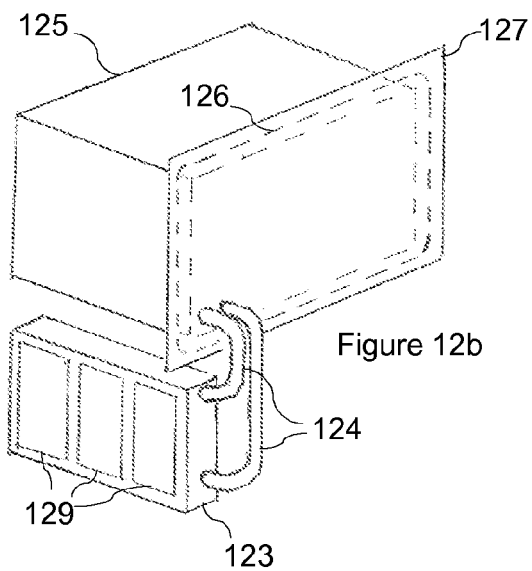
Figure 12C:
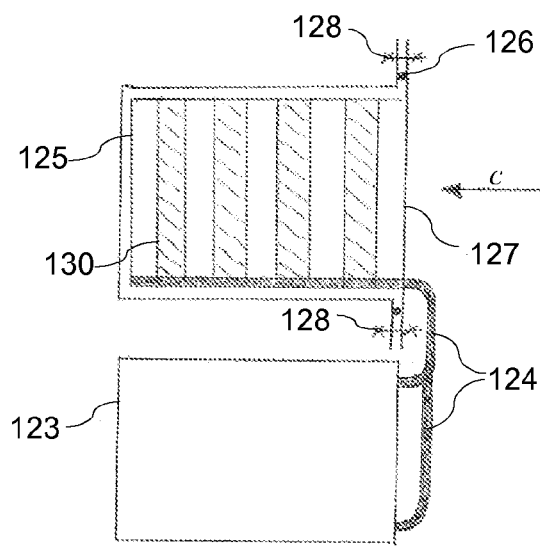

FIGS. 12a, 12b, and 12c illustrate an exemplary cooling arrangement for a traction converter of a rapid transit system in accordance with an exemplary embodiment of the present disclosure. The performance of an air-cooled traction converter can be limited by acoustic noise. Therefore, noise attenuating measures may be specified. An exemplary cooling apparatus according to the present disclosure may be used to attenuate the noise.

During service, the traction converter 120 mounted underneath the car body is accessible only from the side. Therefore, it must be possible to mount and demount power electronic building blocks from the side. The traction converter can also call for inclusion in a high ingress protection (IP) class. For instance, an IP class of 65 or more may be specified, which makes rubber sealings preferable.

With cooling systems made up of an air duct 121, a stack of roll-bonded panels 122, and an evaporator 123, connected to the roll-bonded panels 122 via coolant conduits 124, it is possible to manufacture a power electronic building block 125 which can be inserted from the side of the converter, and which enables easy sealing with an O-ring 126. In FIG. 12c, the O-ring forms a seal between the air duct 121 and a cover 127 fastened with bolts 128.

A feature in sealing is that the normal of the plane of sealing (e.g., separating dirty and clean spaces) points in a direction c of the building block insertion, as illustrated in FIGS. 12a and 12c. FIGS. 12a, 12b, and 12c only show a principle; it is understood that there can be more stacks of panels, evaporators, and power electronic building blocks. There is great flexibility, for example, in arranging the evaporators and IGBT modules 129. The stack of panels 122 (or a sound attenuating composite structure 130 in FIG. 12c, made from panels 122) can be held together by a frame to provide mechanical stability for the power electronic building block 125.

Thus, it will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. A cooling apparatus for cooling a power electronic device, the apparatus comprising:
   at least one panel, the at least one panel is thermally connected to a heat source in order to receive heat from the heat source and is in thermal contact with a cooling air flow in order to transfer heat from the at least one panel, wherein the at least one panel comprises at least one hole between a first side of the panel and a second side of the panel to attenuate an acoustic noise carried by the cooling air flow, wherein the acoustic noise attenuation is effected by a resonator formed by the at least one hole and a cavity or by a friction of a vibrating air flow through the at least one hole.

2. An arrangement comprising a fan for generating the cooling air flow, and at least one apparatus according to claim 1, wherein the panel of the apparatus attenuates acoustic noise generated by the fan.

3. The apparatus according to claim 1, wherein the at least one hole is provided with an element increasing a resistance of the vibrating air flow through the at least one hole, thus increasing the acoustic noise attenuation.

4. An arrangement comprising a fan for generating the cooling air flow, and at least one apparatus according to claim 3, wherein the panel of the apparatus attenuates acoustic noise generated by the fan.

5. The apparatus according to claim 3, wherein two sides of the panel are arranged to be in contact with the air flow such that the vibrating air pressure carried by the air flow generates an air pressure difference between the two sides to induce the vibrating air flow through the at least one hole.

6. The apparatus according to claim 3, wherein the first side of the panel is arranged to be in contact with the cooling air flow, and the at least one hole leads into a chamber on the second side of the panel for acoustic noise to generate the vibrating air flow through the at least one hole.

7. The apparatus according to claim 1, wherein two sides of the panel are arranged to be in contact with the cooling air flow such that the acoustic noise carried by the air flow generates an air pressure difference between the two sides to induce the vibrating air flow through the at least one hole.

8. The apparatus according to claim 7, wherein at least one panel is exposed to an acoustic noise of a first fan on one side, and to an acoustic noise of a second fan on another side, wherein the fans are uncorrelated noise sources at frequencies of interest.

9. The apparatus according to claim 7, wherein the apparatus is configured to create a phase difference in the air pressure by guiding the cooling air flow first in one direction in contact with one side of the panel, and, after making a turn, in an opposite direction in contact with another side of the panel.

10. The apparatus according to claim 1, wherein the first side of the panel is arranged to be in contact with the cooling air flow, and the at least one hole leads into a chamber on the second side of the panel for the acoustic noise to generate the vibrating air flow through the at least one hole.

11. The apparatus according to claim 10, wherein the apparatus comprises at least two stacked panels with gaps between each panel, wherein at least one gap is filled with the absorptive material.

12. The apparatus according to claim 10, wherein the chamber is filled with an absorptive material attached to the second side of the panel.

13. The apparatus according to claim 12, wherein the absorptive material forms walls of the chamber.

14. A method for cooling a power electronic device, the method comprising:
   thermally connecting a panel to a heat source in order to receive heat from the heat source, and arranging the panel to be thermally in contact with a cooling air flow in order to transfer heat from the panel, wherein the panel comprises at least one hole between a first side of the panel and a second side of the panel to attenuate an acoustic noise carried by the cooling air flow, wherein the acoustic noise attenuation is effected by a resonator formed by the at least one hole and a cavity or by a friction of a vibrating air flow through the at least one hole.

* * * * *